United States Patent
Tseng et al.

(10) Patent No.: US 9,755,320 B2
(45) Date of Patent: Sep. 5, 2017

(54) ELECTROMAGNETIC BANDGAP STRUCTURE AND ELECTRONIC DEVICE HAVING THE SAME

(71) Applicant: ASUSTeK COMPUTER INC., Taipei (TW)

(72) Inventors: Bin-Chyi Tseng, Taipei (TW); Tsung-Chieh Yen, Taipei (TW); Chih-Chung Lin, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 128 days.

(21) Appl. No.: 14/622,925

(22) Filed: Feb. 16, 2015

(65) Prior Publication Data

US 2016/0006093 A1   Jan. 7, 2016

(30) Foreign Application Priority Data

Jul. 1, 2014  (TW) .............................. 103122679 A

(51) Int. Cl.
| | | |
|---|---|---|
| *H01Q 1/50* | (2006.01) | |
| *H01Q 19/02* | (2006.01) | |
| *H01P 1/20* | (2006.01) | |
| *H05K 1/00* | (2006.01) | |
| *H01Q 1/24* | (2006.01) | |
| *H01Q 15/00* | (2006.01) | |

(52) U.S. Cl.
CPC ......... *H01Q 19/021* (2013.01); *H01P 1/2005* (2013.01); *H01Q 1/243* (2013.01); *H01Q 15/006* (2013.01); *H05K 1/00* (2013.01)

(58) Field of Classification Search
CPC ... H01Q 21/065; H01Q 19/005; H01Q 9/0407
USPC .......................................... 343/850, 866, 895
See application file for complete search history.

(56) References Cited

U.S. PATENT DOCUMENTS

| 7,764,149 B2 | 7/2010 | Han et al. | |
|---|---|---|---|
| 2010/0214178 A1* | 8/2010 | Toyao ................... | H01P 1/2005 |
| | | | 343/702 |
| 2011/0026234 A1 | 2/2011 | Kim et al. | |
| 2013/0321220 A1* | 12/2013 | Toujo ..................... | H01Q 13/08 |
| | | | 343/702 |
| 2017/0033468 A1* | 2/2017 | Wong .................... | H01P 1/2005 |

FOREIGN PATENT DOCUMENTS

| JP | 2006253929 | 9/2006 |
|---|---|---|
| TW | I318851 | 12/2009 |

* cited by examiner

*Primary Examiner* — Hoang Nguyen
*Assistant Examiner* — Jae Kim
(74) *Attorney, Agent, or Firm* — Jianq Chyun IP Office

(57) ABSTRACT

An electromagnetic bandgap structure and an electronic device having the same are provided. The electromagnetic bandgap structure includes a first conductive element, a second conductive element and a planar inductive element. The planar inductive element is disposed between the first conductive element and the second conductive element. Furthermore, the planar inductive element is electrically connected to the first conductive element via a first conductive pillar, and it is electrically connected to the second conductive element via a second conductive pillar.

8 Claims, 7 Drawing Sheets

ELECTROMAGNETIC BANDGAP STRUCTURE AND ELECTRONIC DEVICE HAVING THE SAME

CROSS-REFERENCE TO RELATED APPLICATION

This application claims the priority benefit of Taiwan application serial No. 103122679, filed on Jul. 1, 2014. The entirety of the above-mentioned patent application is hereby incorporated by reference herein and made a part of specification.

BACKGROUND OF THE INVENTION

Field of the Invention

The invention relates to an electronic device and, more particularly, to an electronic device with an antenna.

Description of the Related Art

When a metal back cover is applied to a mobile phone or a tablet computer, a distance (which is, for example, larger than 5 mm) should be provided between a built-in antenna and the metal back cover. If the distance is too short, the radiation of the antenna would be affected and the efficiency of the antenna decreases. Conventionally, a slot is formed at the metal back cover for the induced current to flow along the metal back cover, and thus the current of the antenna body would not be cancelled out. However, the overall appearance of the metal back cover is affected.

An electromagnetic bandgap (EBG) structure prevents the transmission of the surface wave, and thus the electromagnetic bandgap structure is widely used in electronic device. FIG. 1 is a schematic diagram showing a conventional electromagnetic bandgap structure. As shown in FIG. 1, the electromagnetic bandgap structure includes a first conductive element 110 and a second conductive element 120 which form a two-layer structure, and the second conductive element 120 is electrically connected to the first conductive element 110 via a conductive pillar 130.

In operation, the conductive pillar of the electromagnetic bandgap structure provides an equivalent inductance, and an operating frequency of the electromagnetic bandgap structure is lowered by increasing the length of the conductive pillar. For example, when the length of the conductive pillar increases, the equivalent inductance also increases, and the operating frequency of the electromagnetic bandgap structure decreases. However, when the length of the conductive pillar increases, the height of the electromagnetic bandgap structure also increases, and thus the electromagnetic bandgap structure cannot meet the requirement of a thinner and lighter electronic device.

BRIEF SUMMARY OF THE INVENTION

An electromagnetic bandgap structure and an electronic device having the same are provided. A planar inductive element is used in the electromagnetic bandgap structure to increase an equivalent inductance and keeps the electronic device thinner.

An electromagnetic bandgap structure includes a first conductive element, a second conductive element and a planar inductive element. The planar inductive element is disposed between the first conductive element and the second conductive element. The planar inductive element is electrically connected to the first conductive element via the first conductive pillar, and it is electrically connected to the second conductive element via the second conductive pillar.

An electronic device is further provided and includes a metal housing and an electromagnetic bandgap structure. The electromagnetic bandgap structure is disposed at the metal housing or forms a part of the metal housing. The electromagnetic bandgap structure includes a first conductive element, a second conductive element and a planar inductive element. The planar inductive element is disposed between the first conductive element and the second conductive element. Furthermore, the planar inductive element is electrically connected to the first conductive element via the first conductive pillar, and it is electrically connected to the second conductive element via the second conductive pillar.

These and other features, aspects and advantages of the present invention will become better understood with regard to the following description, appended claims, and accompanying drawings.

DETAILED DESCRIPTION OF THE EMBODIMENTS

Figure 1:
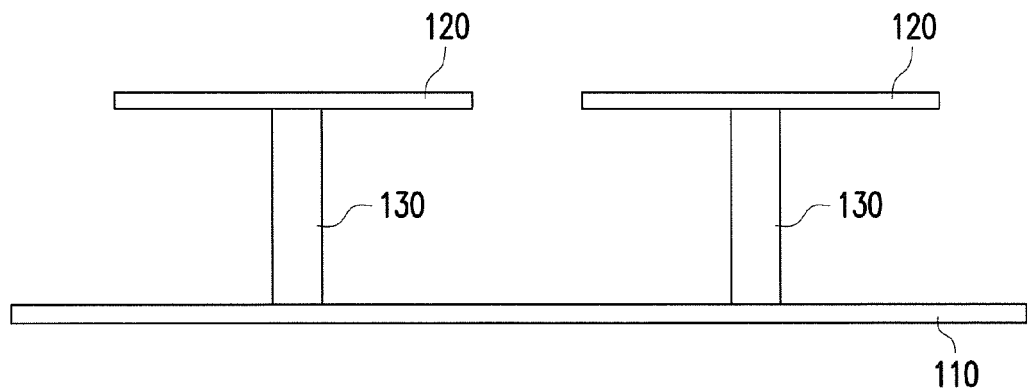
FIG. 1 is a schematic diagram showing a conventional electromagnetic bandgap structure.
Figure 2:
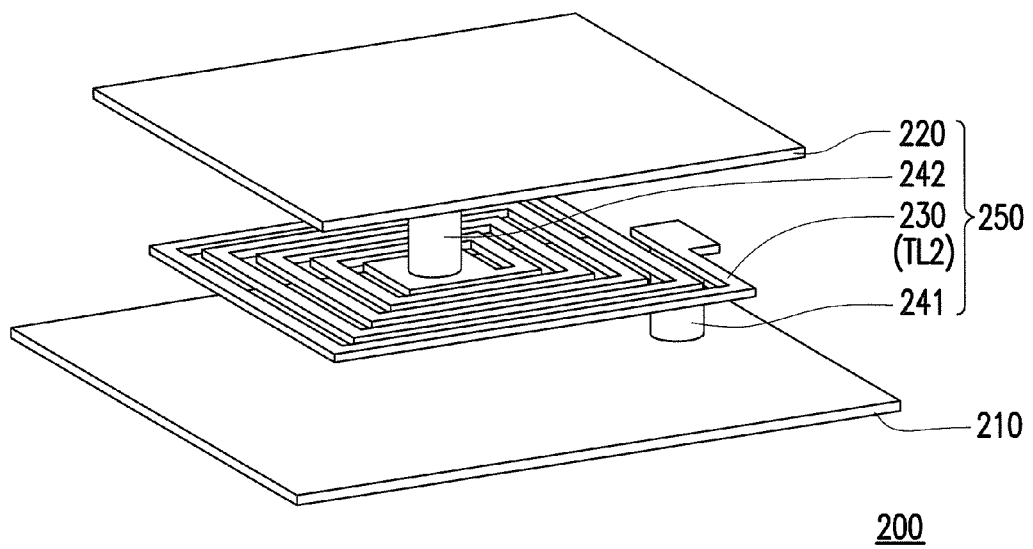
FIG. 2 is a schematic diagram showing an electromagnetic bandgap structure in an embodiment.

FIG. 2 is a schematic diagram showing an electromagnetic bandgap structure in an embodiment. As shown in FIG. 2, the electromagnetic bandgap structure 200 includes a first conductive element 210, a second conductive element 220, a planar inductive element 230, a first conductive pillar 241 and a second conductive pillar 242. The planar inductive element 230 is disposed between the first conductive element 210 and the second conductive element 220, and the first conductive element 210 may be a system ground plane. The planar inductive element 230 is electrically connected to the first conductive element 210 and the second conductive element 220 via the first conductive pillar 241 and the second conductive pillar 242, respectively.

The first conductive pillar 241 and the second conductive pillar 242 provide two equivalent inductances, respectively. Moreover, since the planar inductive element 230 is electrically connected to the conductive pillars 241 and 242, respectively, the planar inductive element 230 is connected to the two equivalent inductances formed by the first conductive pillar 241 and the second conductive pillar 242 in series. The first conductive pillar 241, the planar inductive element 230 and the second conductive pillar 242 form the equivalent inductance of the electromagnetic bandgap structure 200. Consequently, the equivalent inductance of the electromagnetic bandgap structure 200 is increased via the planar inductive element 230 and the operating frequency of the electromagnetic bandgap structure 200 is lowered. In other words, it does not need to increase the length of the conductive pillars 241 and 242 of the electromagnetic bandgap structure 200 to lower the operating frequency, and the electronic device becomes thinner.

Furthermore, the planar inductive element 230 includes a transmission line TL2. The first end of the transmission line TL2 is electrically connected to the first end of the second conductive pillar 242, and the second end of the transmission line TL2 is electrically connected to a first end of the first conductive pillar 241. The second end of the second conductive pillar 242 is electrically connected to the second conductive element 220, and the second end of the first conductive pillar 241 is electrically connected to the first conductive element 210. The transmission line TL2 extends spirally regarding the first end as a center, and a spiral transmission line TL2 is formed. The shape of the transmission line TL2 is not limited to that shown in FIG. 2. Persons having ordinary skills in the art can adjust the shape of the transmission line TL2 according to requirements.

Figure 3:
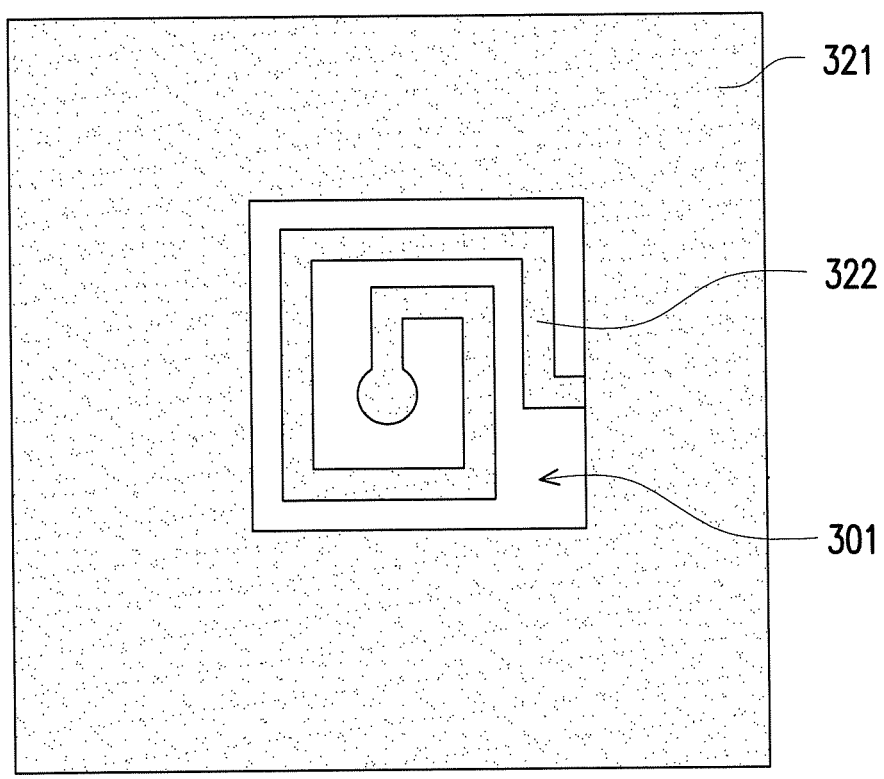
FIG. 3 is a schematic diagram showing a second conductive element in an embodiment.

The equivalent inductance of the electromagnetic bandgap structure 200 is further increased via a partial structure of the second conductive element 220. For example, FIG. 3 is a schematic diagram showing the second conductive element in an embodiment. As shown in FIG. 3, the second conductive element 320 includes a conductive portion 321 and a transmission line 322. The conductive portion 321 includes an opening 301. The transmission line 322 is disposed in the opening 301 of the conductive portion 321. Moreover, the first end of the transmission line 322 is electrically connected to the conductive portion 321, and the second end of the transmission line 322 is electrically connected to the second conductive pillar 242. In other words, the transmission line 322, the second conductive pillar 242, the planar inductive element 230 and the first conductive pillar 241 are connected to each other in series. Consequently, the transmission line 322 of the second conductive element 320 further increases the equivalent inductance of the electromagnetic bandgap structure 200. Additionally, the transmission line 322 may include multiple bends, so as to reduce the size of the second conductive element 320.

Please refer to FIG. 2, the second conductive element 220, the second conductive pillar 242, the planar inductive element 230 and the first conductive pillar 241 can form an electromagnetic bandgap unit 250. In other words, in the electromagnetic bandgap structure 200 shown in FIG. 2, an electromagnetic bandgap unit 250 is disposed at the first conductive element 210. In another embodiment, a plurality of the electromagnetic bandgap units may be disposed at the first conductive element to form the electromagnetic bandgap structure.

Figure 4:
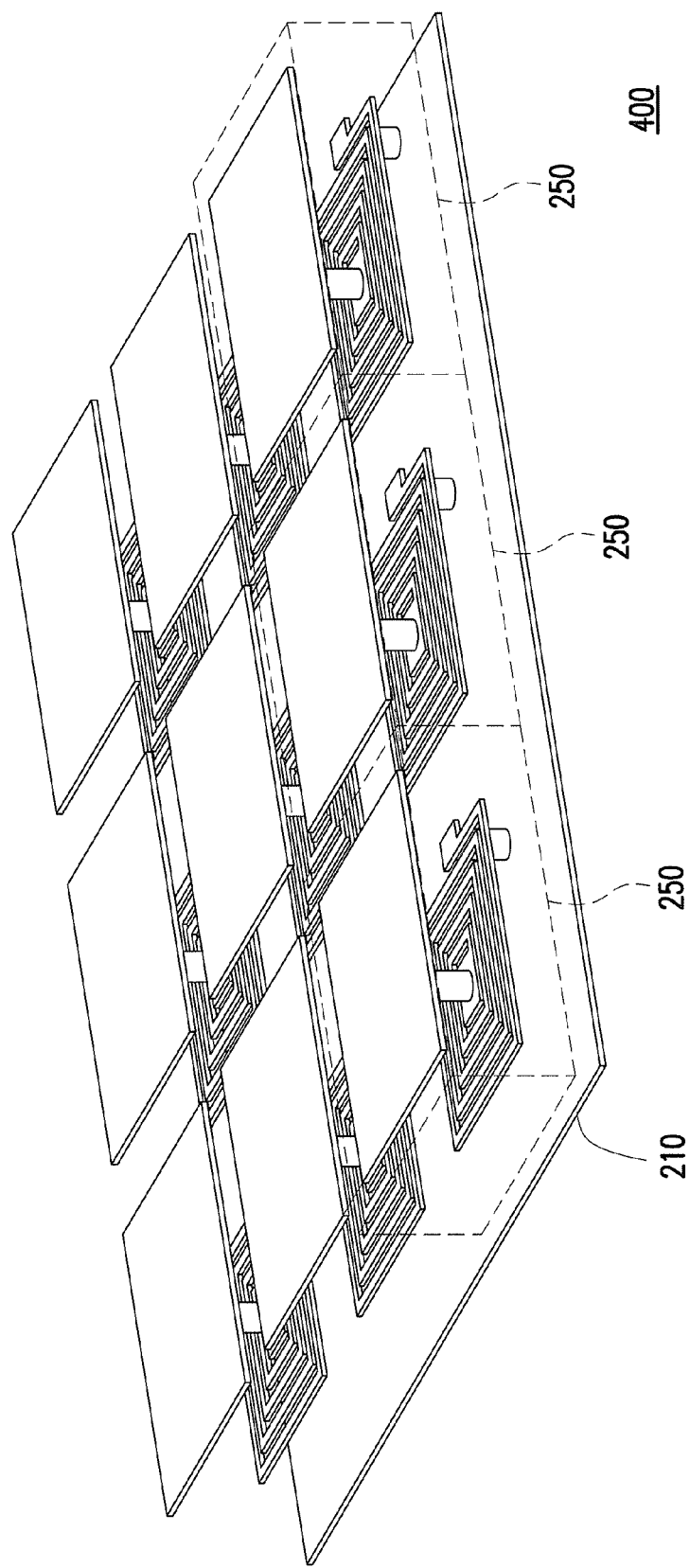
FIG. 4 is a three-dimension diagram showing an array of electromagnetic bandgap structures in an embodiment.
Figure 5:
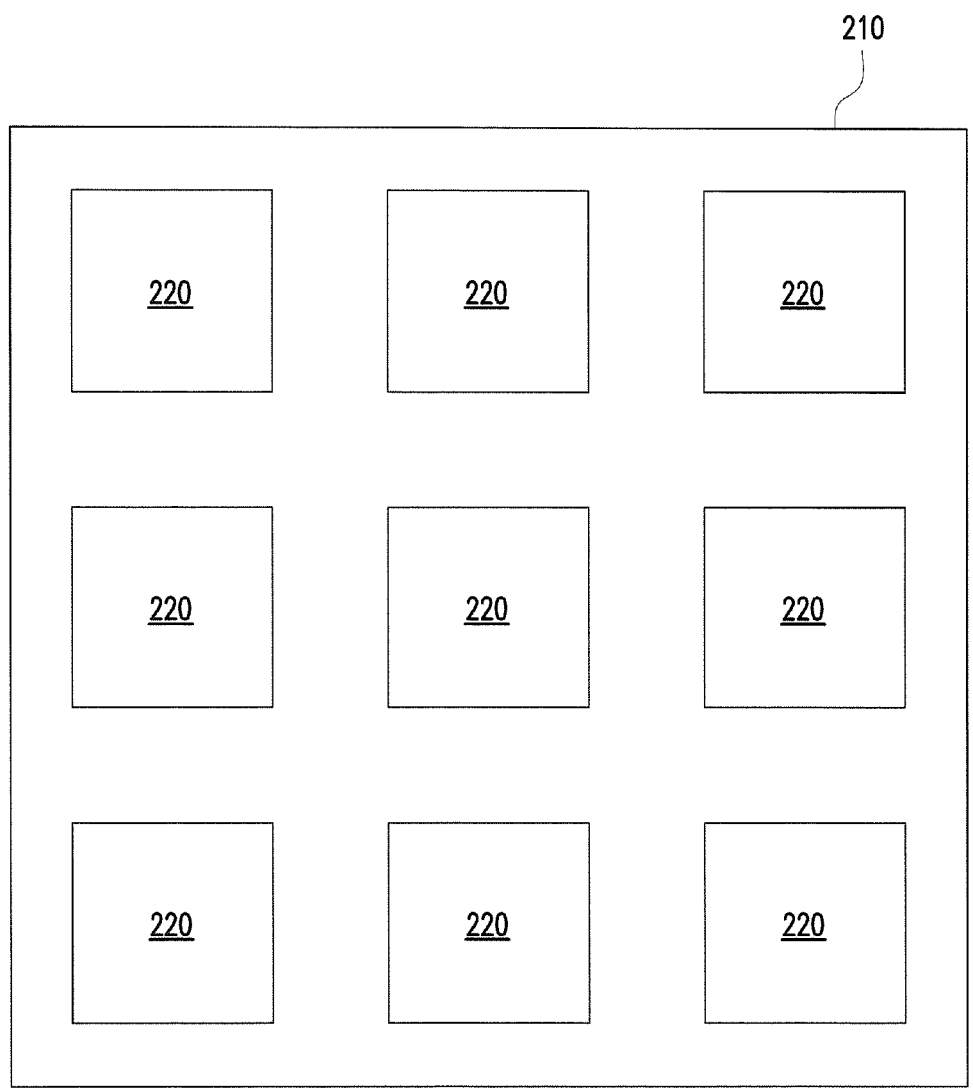
FIG. 5 is a plan showing an array of electromagnetic bandgap structures in an embodiment.
Figure 6:
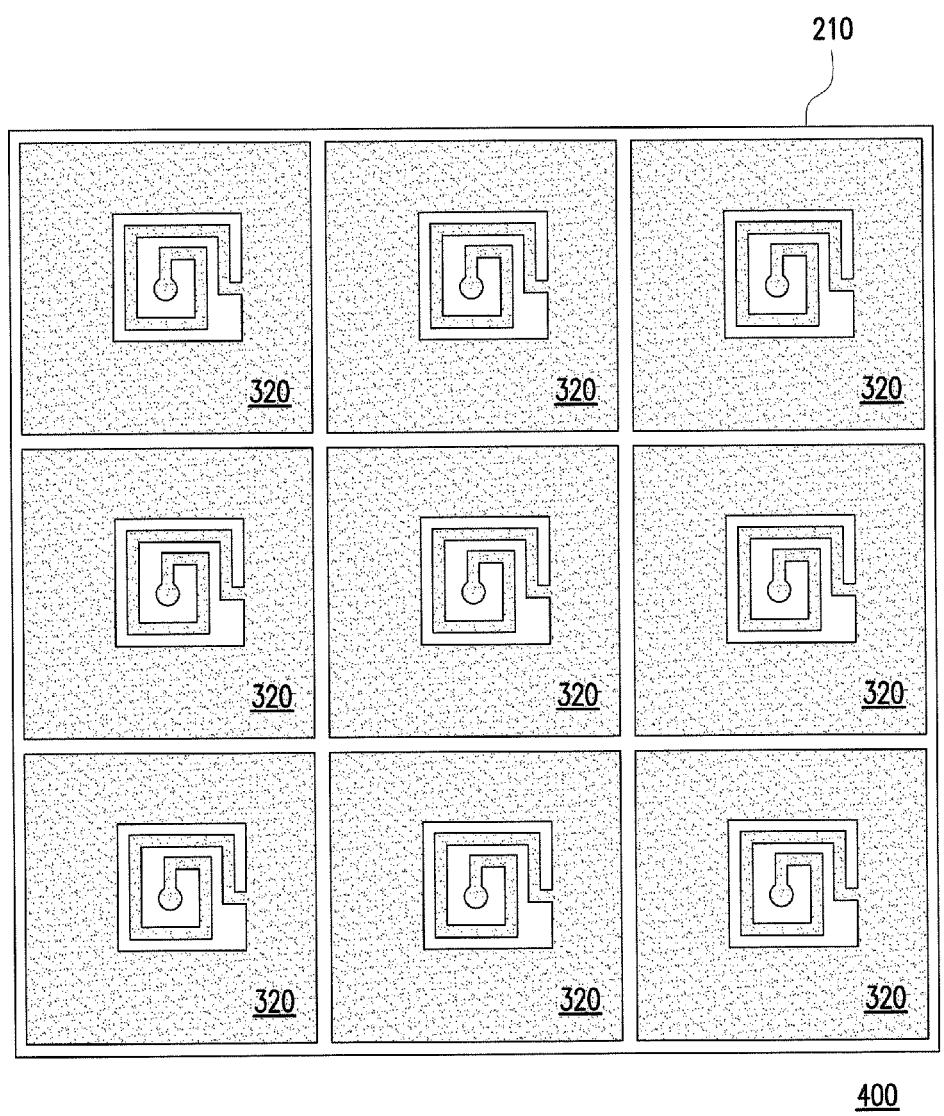
FIG. 6 is a plan showing an array of electromagnetic bandgap structures in another embodiment.

For example, FIG. 4 is a three-dimension diagram showing an array of the electromagnetic bandgap structures in an embodiment, FIG. 5 is a plan showing an array of the electromagnetic bandgap structures in an embodiment, and FIG. 6 is a plan showing an array of the electromagnetic bandgap structures in another embodiment. As shown in FIG. 4, the electromagnetic bandgap structure 400 includes a plurality of the electromagnetic bandgap units 250 and a first conductive element 210, and the electromagnetic bandgap units 250 are periodically arranged at the first conductive element 210. For example, the electromagnetic bandgap units 250 may be disposed at the first conductive element 210 with a matrix arrangement. Furthermore, as shown in FIG. 5 and FIG. 6, the second conductive element of the electromagnetic bandgap units 250 may be the second conductive element 220 in FIG. 2 or the second conductive element 320 in FIG. 3.

Figure 7:
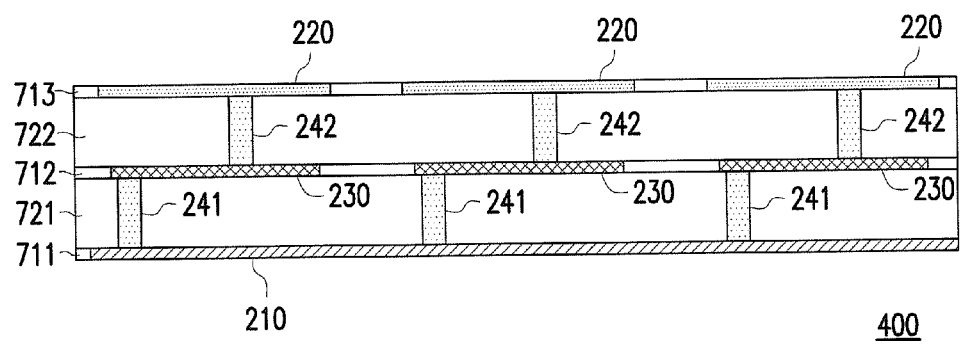
FIG. 7 is a sectional diagram showing an array of electromagnetic bandgap structures in an embodiment.

FIG. 7 is a sectional diagram showing an array of the electromagnetic bandgap structures in an embodiment. As shown in FIG. 7, the electromagnetic bandgap structure 400 includes circuit layers 711 to 713 and dielectric layers 721 and 722. The dielectric layer 721 is disposed between the circuit layer 711 and the circuit layer 712, and the dielectric layer 722 is disposed between the circuit layer 712 and the circuit layer 713. Furthermore, the first conductive element 210 is disposed at the circuit layer 711, the planar inductive element 230 is disposed at the circuit layer 712, and the second conductive element 220 is disposed at the circuit layer 713.

The first conductive pillar 241 penetrates through the dielectric layer 721 and is electrically connected to the first conductive element 210 and the planar inductive element 230. The second conductive pillar 242 penetrates through the dielectric layer 722 and is electrically connected to the planar inductive element 230 and the second conductive element 220. In other words, the electromagnetic bandgap structure 400 includes a three-layer structure formed by the first conductive element 210, the planar inductive element 230 and the second conductive element 220. Moreover, the planar inductive element 230 in the three-layer structure is used to increase the equivalent inductance of the electromagnetic bandgap structure 200, so as to make the electronic device thinner.

Figure 8:
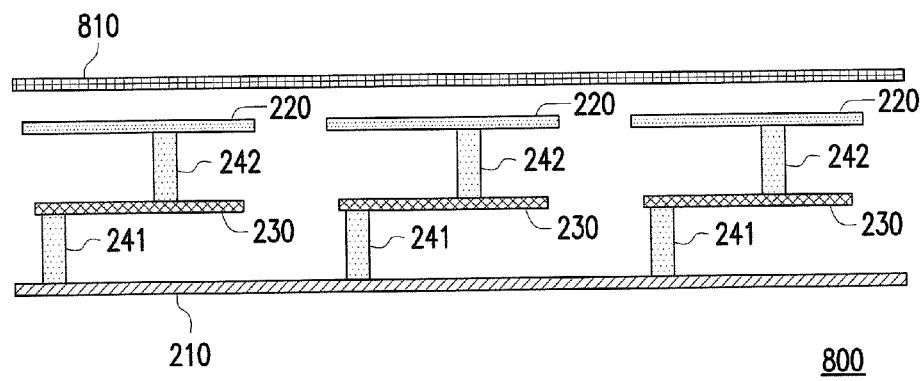
FIG. 8 is a sectional diagram showing an array of electromagnetic bandgap structures in another embodiment.

In another embodiment, the electromagnetic bandgap structure 400 may also include a four-lay structure. For example, FIG. 8 is a sectional diagram showing an array of the electromagnetic bandgap structures in another embodiment. The difference between the embodiment shown in FIG. 8 and that in FIG. 7 is that the electromagnetic bandgap structure 800 in FIG. 8 further includes a third conductive element 810.

In detail, the third conductive element 810 is disposed above the second conductive element 220. That means, the second conductive element 220 and the planar inductive element 230 are disposed between the first conductive element 210 and the third conductive element 810. The second conductive element 220 and the third conductive element 810 can form an equivalent capacitor of the electromagnetic bandgap structure 800, and the first conductive pillar 241, the planar inductive element 230 and the second conductive pillar 242 can form an equivalent inductance of the electromagnetic bandgap structure 800. Moreover, the equivalent capacitor is connected to the equivalent inductance in series to form a bandstop filter. Consequently, the electromagnetic bandgap structure 800 restrain the flowing of the surface current at the third conductive element 810, and the noise in a specific band is filtered out. Thus, the electromagnetic bandgap structure 800 can be widely used in various electronic devices.

For example, the electronic device may have a metal housing to show the uniqueness of the product. Additionally, a corresponding electromagnetic bandgap structure is applied in the electronic device to avoid affection on the antenna element from the metal housing.

Practically, the electromagnetic bandgap structure 200, 400 or 800 may be disposed at the surface of the metal housing of the electronic device, or the electromagnetic bandgap structure 200, 400 or 800 forms a part of the metal housing of the electronic device. Moreover, the antenna element of the electronic device may be disposed above the electromagnetic bandgap structure 200, 400 or 800, so as to avoid the affection on the antenna element from the metal housing.

Figure 9:
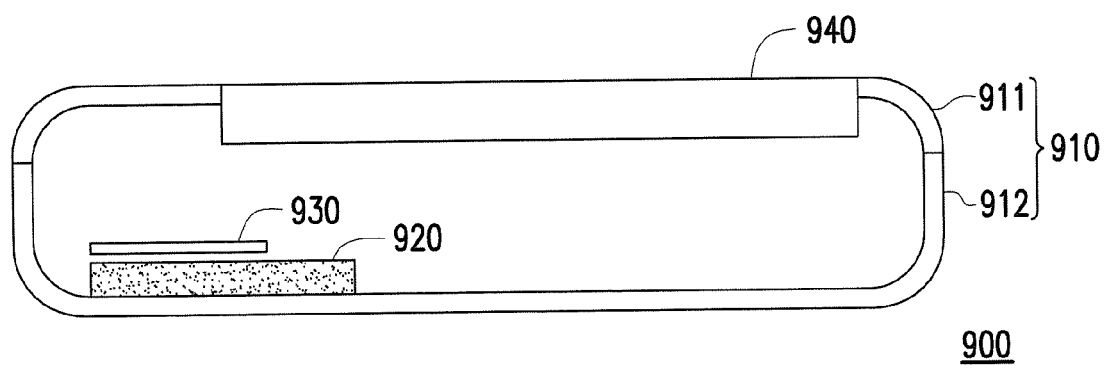
FIG. 9 is a sectional diagram showing an electronic device in an embodiment.

For example, FIG. 9 is a sectional diagram showing an electronic device in an embodiment. As shown in FIG. 9, the electronic device 900 includes a metal housing 910, an electromagnetic bandgap structure 920, an antenna element 930 and a display panel 940, and the metal housing 910 includes an upper cover 911 and a lower cover 912. The display panel 940 is exposed from the upper cover 911, and the upper cover 911 and the lower cover 912 are combined to form an accommodation space. The electromagnetic bandgap structure 920 and the antenna element 930 are disposed in the accommodation space. Moreover, the electromagnetic bandgap structure 920 is disposed at the surface of the lower cover 912 or forms a part of the lower cover 912. The antenna element 930 is relative to the electromagnetic bandgap structure 920.

Furthermore, the electromagnetic bandgap structure 920 may consist of the electromagnetic bandgap structure 200, 400 or 800. For example, when the electromagnetic bandgap structure 920 consists of the electromagnetic bandgap structure 200 in FIG. 2 or the electromagnetic bandgap structure 400 in FIG. 4, the first conductive element 210 of the electromagnetic bandgap structure 200 or 400 is disposed at the surface of the lower cover 912 or forms a part of the lower cover 912. The antenna element 930 is disposed at a side of the second conductive element 220 of the electromagnetic bandgap structure 200 or 400, and the side is away from the planar inductive element, and a distance exists between the antenna element 930 and the second conductive element 220. Moreover, when the electromagnetic bandgap structure 920 consists of the electromagnetic bandgap structure 800, the first conductive element 210 of the electromagnetic bandgap structure 800 is disposed at the surface of the lower cover 912 or forms a part of the lower cover 912, and the antenna element 930 is disposed at the third conductive element 810 of the electromagnetic bandgap structure 800. Consequently, the affection on the antenna element 930 from the metal housing 910 is avoided via the electromagnetic bandgap structure 920 in the electronic device 900.

In sum, the electromagnetic bandgap structure includes a three-layer structure formed by the first conductive element, the planar inductive element and the second conductive element. Additionally, the equivalent inductance of the electromagnetic bandgap structure is increased via the planar inductive element in the three-layer structure. In other words, the operating frequency of the electromagnetic bandgap structure is lowered without increasing the length of the conductive pillars, and thus keeps the electronic device thinner.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. An electromagnetic bandgap structure comprising:
    a first conductive element;
    a second conductive element comprising a loop-shaped conductive portion and a first transmission line, the loop-shaped conductive portion comprising a closed opening, the first transmission line being spiral in shape and disposed in the closed opening;
    a planar inductive element disposed between the first conductive element and the second conductive element, and comprising a second transmission line, wherein the planar inductive element is electrically connected to the first conductive element via a first conductive pillar, the planar inductive element is electrically connected to the second conductive element via a second conductive pillar, a first end of the second transmission line is electrically connected to a first end of the second conductive pillar, a second end of the second transmission line is electrically connected to a first end of the first conductive pillar, a second end of the first conductive pillar is electrically connected to the first conductive element, a first end of the first transmission line is electrically connected to the loop-shaped conductive portion, and a second end of the first transmission line is electrically connected to a second end of the second conductive pillar; and
    a third conductive element, wherein the second conductive element and the third conductive element form a capacitor of the electromagnetic bandgap structure, and the second conductive element and the planar inductive element are disposed between the first conductive element and the third conductive element.

2. The electromagnetic bandgap structure according to claim 1, wherein the second transmission line is spiral in shape.

3. The electromagnetic bandgap structure according to claim 1, wherein the first transmission line includes multiple bends.

4. The electromagnetic bandgap structure according to claim 1, wherein the electromagnetic bandgap structure further includes:
    a first circuit layer, wherein the first conductive element is disposed at the first circuit layer;
    a second circuit layer, wherein the planar inductive element is disposed at the second circuit layer; and
    a third circuit layer, wherein the second conductive element is disposed at the third circuit layer, and the second circuit layer is disposed between the first circuit layer and the third circuit layer.

5. The electromagnetic bandgap structure according to claim 4, wherein the electromagnetic bandgap structure further includes:
    a first dielectric layer disposed between the first circuit layer and the second circuit layer, wherein the first conductive pillar penetrates through the first dielectric layer; and
    a second dielectric layer disposed between the second circuit layer and the third circuit layer, wherein the second conductive pillar penetrates through the second dielectric layer.

6. An electronic device comprising:
    a metal housing; and
    an electromagnetic bandgap structure disposed at the metal housing or forming a part of the metal housing, wherein the electromagnetic bandgap structure includes:
        a first conductive element;
        a second conductive element comprising a loop-shaped conductive portion and a first transmission line, the loop-shaped conductive portion comprising a closed opening, the first transmission line being spiral in shape and disposed in the closed opening;
        a planar inductive element disposed between the first conductive element and the second conductive element, and comprising a second transmission line, wherein the planar inductive element is electrically connected to the first conductive element via a first conductive pillar, the planar inductive element is electrically connected to the second conductive element via a second conductive pillar, a first end of the second transmission line is electrically connected to a first end of the second conductive pillar, a second end of the second transmission line is electrically connected to a first end of the first conductive pillar, a second end of the first conductive pillar is electrically connected to the first conductive element, a first end of the first transmission line is electrically connected to the loop-shaped conductive portion, and a second end of the first transmission line is electrically connected to a second end of the second conductive pillar; and a third conductive element, wherein the second conductive element and the third conductive element form a capacitor of the electromagnetic bandgap structure, and the second conductive element and the planar inductive element are disposed between the first conductive element and the third conductive element.

7. The electronic device according to claim 6, wherein the electronic device further includes:

an antenna element disposed at a side of the second conductive element away from the planar inductive element, wherein a distance exists between the antenna element and the second conductive element.

8. The electronic device according to claim 6, wherein the electronic device further includes:

an antenna element disposed at the third conductive element.

* * * * *